United States Patent
Yin et al.

(10) Patent No.: US 8,664,119 B2
(45) Date of Patent: Mar. 4, 2014

(54) SEMICONDUCTOR DEVICE MANUFACTURING METHOD

(75) Inventors: Huaxiang Yin, Beijing (CN); Qiuxia Xu, Beijing (CN); Lingkuan Meng, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/497,526

(22) PCT Filed: Nov. 28, 2011

(86) PCT No.: PCT/CN2011/001979
§ 371 (c)(1),
(2), (4) Date: Mar. 21, 2012

(87) PCT Pub. No.: WO2013/016852
PCT Pub. Date: Feb. 7, 2013

(65) Prior Publication Data
US 2013/0137264 A1    May 30, 2013

(30) Foreign Application Priority Data
Jul. 29, 2011    (CN) .......................... 2011 1 0215069

(51) Int. Cl.
*H01L 21/311* (2006.01)
*H01L 21/461* (2006.01)

(52) U.S. Cl.
USPC ........... 438/694; 438/183; 438/697; 438/719; 438/724; 438/744

(58) Field of Classification Search
USPC ................. 438/183, 694, 697, 719, 724, 744
See application file for complete search history.

(56) References Cited

U.S. PATENT DOCUMENTS

| | | | |
|---|---|---|---|
| 5,316,980 A | 5/1994 | Takeshiro | 437/228 |
| 6,303,418 B1 | 10/2001 | Cha et al. | 438/199 |
| 6,528,362 B1 | 3/2003 | Besser et al. | 438/197 |
| 7,361,565 B2 | 4/2008 | Shin et al. | 438/303 |
| 2005/0118757 A1 | 6/2005 | Cabral, Jr. et al. | 438/199 |
| 2010/0112798 A1* | 5/2010 | Lai et al. | 438/591 |
| 2012/0122283 A1* | 5/2012 | Lee et al. | 438/287 |
| 2012/0248550 A1* | 10/2012 | Huang et al. | 257/410 |
| 2012/0264279 A1* | 10/2012 | Lu et al. | 438/585 |
| 2012/0264281 A1* | 10/2012 | Chen et al. | 438/591 |
| 2013/0017678 A1* | 1/2013 | Tsai et al. | 438/591 |

FOREIGN PATENT DOCUMENTS

CN        1624902 A    6/2005    ......... H01L 21/8238

\* cited by examiner

*Primary Examiner* — Binh X Tran
(74) *Attorney, Agent, or Firm* — Martine Penilla Group, LLP

(57) ABSTRACT

A semiconductor device manufacturing method, comprising: providing a semiconductor substrate, on which a gate conductor layer as well as a source region and a drain region positioned on both sides of the gate conductor layer are provided, forming an etch stop layer on the semiconductor substrate, forming an LTO layer on the etch stop layer, chemical mechanical polishing the LTO layer, forming an SOG layer on the polished LTO layer, the etch stop layer, LTO layer and SOG layer forming a front metal insulating layer, back etching the SOG layer and etch stop layer of the front metal insulating layer to expose the gate conductor layer, and removing the gate conductor layer.

18 Claims, 4 Drawing Sheets

SEMICONDUCTOR DEVICE MANUFACTURING METHOD

CLAIM OF PRIORITY

This application is a Section 371 National Stage Application of International Application No. PCT/CN2011/001979, filed on Nov. 28, 2011, which claims priority to Chinese Application No. CN201110215069.2, filed on Jul. 29, 2011 entitled "Semiconductor Device and Manufacturing Method", the entire contents of which are incorporated herein by reference in their entirety.

FIELD OF THE INVENTION

The present invention relates to a semiconductor device manufacturing method, in particular to a semiconductor device manufacturing method employing a gate-last process.

BACKGROUND OF THE INVENTION

Polysilicon gates prevent further improvement of the performance of metal oxide semiconductor (MOS) devices when the size of the devices is continuously reduced, due to the excessive large resistance of the gates, polysilicon depletion effect and boron penetration effect in PMOS transistors. Meanwhile, a serious interface defect is usually formed when integrating a polysilicon gate with a high K gate dielectric, which results in a pinning phenomenon of the device threshold and reduction in carrier mobility in channel. Therefore, a gate structure is put forward in which a metal gate is used to replace the polysilicon gate.

In an MOS device, the processes of integrating a metal gate/high K gate stack include a gate-first process and a gate-last process. In the gate-first process, a metal gate/high K gate stack is formed first, then the steps of source/drain regions implantation and activation annealing are performed. In the step of activation annealing of the source/drain regions, many materials of the metal gate react with the high K gate dielectric. Thus in the gate-first process, the materials of the metal gate are limited, which accordingly limits the increase of the threshold voltage of the device. In the gate-last process, a dummy gate (i.e. a sacrificial gate) of a polysilicon material, for example, is formed first, then the steps of source/drain regions implantation and activation annealing are performed, finally, the dummy gate is removed and a metal gate (i.e. a replacement gate) is formed. In the gate-last process, the material of the metal gate does not undergo the step of the activation annealing of the source/drain regions, and the processing temperature after forming the metal gate is usually under 500° C. By means of the gate-last process, more materials can be selected to form the metal gate so as to obtain the desired threshold voltage and to reduce the interface defect density of the metal gate/high K. Hence, the gate-last process has become an increasingly attractive option for integrating the metal gate.

In the gate-last process, the dummy gate needs to be covered by an interlayer dielectric layer (ILD) after its formation, then a smooth surface is formed on the ILD layer using Chemical Mechanical Polishing (CMP), afterwards, the dummy gate is removed and the opening formed thereby is filled with the material of the metal gate.

Moreover, the ILD layer also separates the metal wiring layer and the active layer of the semiconductor device, and the conductive via in the ILD layer is used to realize an electrical connection between the metal wiring and active regions of the semiconductor device. The ILD layer with a smooth surface can help the deposition and patterning of the metal gate material, help the electrical insulation between the metal wiring and the semiconductor device thereunder, and help formation of an interconnection of repeated metal wirings. Besides, the mechanical strength and reliability of the semiconductor device are improved thanks to the absence of such defect as cavity.

However, compared to the gate-first process, the gate-last process includes additional CMP processing in order to obtain an ILD layer with a smooth surface, thus increasing complexity of the manufacturing process and the cost, especially on the first isolation layer isolating the gate stack structure of a subminiature gate length. Besides, the CMP processing also has the following technical difficulties:

planarizing multiple materials (silicon oxide, silicon nitride, polysilicon) by CMP on the same platform terminal monitoring of a super-thin isolation layer (about 100 nm in thickness with high uniformity)

new polishing liquid that is advanced and expensive has to be developed.

A method of depositing conformal insulating layers, for example, a two-layered ILD layer structure of a low temperature oxide (LTO) layer and a spin coating glass (SOG) layer on the LTP layer, may be used to replace the CMP processing, wherein the LTO layer forms a conformal cover layer on a wafer of a large area, while the SOG layer further fills the dents of the surface profile, thus an approximately smooth surface is obtained.

Then, in order to further form a smooth surface, a dry etching, such as reactive ion etching, is used to back etch the SOG layer for planarization. In the reactive ion etching, a gas mixture of trifluoromethane ($CHF_3$) and oxygen ($O_2$) is usually used as the etching gas.

In the U.S. Pat. No. 5,316,980A by Shinichi Takeshiro, et. al., it is further provided that a gas mixture of trifluoromethane ($CHF_3$) and hexafluoroethane ($C_2F_6$) is used as the etching gas, so that the rate of etching the organic SOG layer is lower than the rate of etching the underlying $SiO_2$ layer, as a result, a smooth structural surface can still be obtained even if the underlying $SiO_2$ is partially exposed.

However, the above-mentioned existing SOG layer etching method actually cannot obtain an overall smoothness. It has been found that during the etching, the rate of etching the SOG layer in the center of the wafer is lower than that in the edges of the wafer, and the section plane of the etched SOG layer is of a convex shape. As a result, the SOG layer at the edges of the wafer does not have the desired smoothness and has to be abandoned, thus the area of the wafer that can be used for manufacturing a semiconductor device is reduced. Moreover, there is a serious pattern effect during the overall planarizing process (i.e. pattern size and pattern density influence thick film etching rate).

SUMMARY OF THE INVENTION

The object of the present invention is to provide a semiconductor device manufacturing method that employs a gate-last process, wherein an etching process is used to replace the CMP process to obtain a smooth ILD layer surface.

According to one aspect of the present invention, a semiconductor device manufacturing method is provided, which comprises: providing a semiconductor substrate, on which a gate conductor layer as well as a source region and a drain region positioned on both sides of the gate conductor layer are provided, forming an etch stop layer on the semiconductor substrate, forming an LTO layer on the etch stop layer, chemical mechanical polishing the LTO layer, forming an SOG layer on the polished LTO layer, the etch stop layer, LTO layer and SOG layer forming a pre-metal insulating layer, back etching the SOG layer and etch stop layer of the pre-metal insulating layer to expose the gate conductor layer, removing the gate conductor layer.

BRIEF DESCRIPTION OF THE DRAWINGS

In the figures, the same reference signs denote the same or similar elements, wherein.

DETAILED DESCRIPTION OF THE PREFERRED EMBODIMENTS

One or more aspects of the embodiment of the present invention will be described below with reference to the figures, wherein throughout the figures, the same elements are usually represented by the same reference signs. In the descriptions below, many specific details are elucidated for the purpose of explanation, so that a thorough understanding of one or more aspects of the embodiment of the present invention can be provided. However, it is obvious to those skilled in the art that one or more aspects of the embodiment of the present invention may be implemented by said specific details of a lower degree.

In addition, although specific features or aspects of the embodiment are disclosed with respect to only one preferred embodiment among some preferred embodiments, such features or aspects can be combined with one or more other features or aspects of other preferred embodiments that might be desirable for and advantageous to any given or specific application.

Figure 1:
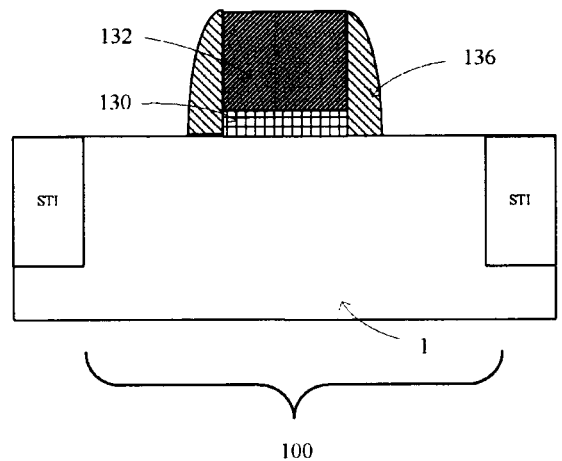
FIG. 1 shows the step of providing a semiconductor substrate 1 in an embodiment of a method for manufacturing a semiconductor device according to the present invention.

An exemplary method of manufacturing a semiconductor device according to the embodiment of the present invention first provides a semiconductor substrate 1, as shown in FIG. 1. The material of the semiconductor substrate 1 includes, but not limited to, Si, SOI, strained Si, SSOI, SiGe, Ge, III-V, metal oxide semiconductor, polysilicon, and the like. Although the present invention is described using monocrystalline silicon hereinafter, embodiments using other semiconductor materials are also explicitly considered herein.

The semiconductor substrate 1 includes a semiconductor region 100 (active region) defined by shallow trench isolation (STI). The semiconductor region 100 has a doping of a first conductive type and a first doping concentration. For example, the semiconductor region 100 may be an NMOS device region (e.g. an NMOS device region of a CMOS transistor) or a PMOS device region (e.g. a PMOS device region of a CMOS transistor), an NMOS device is formed in the NMOS device region, and a PMOS device is formed in the PMOS device region.

A gate stack of the transistor is formed on the semiconductor region 100 (which includes a gate dielectric layer 130 and a gate conductor layer 132 on the gate dielectric layer 130), and gate spacers 136 are formed on both sides of the gate stack. The gate conductor layer 132 in the gate stack structure serves as a dummy gate, which is, for example, made of polysilicon and is removed after forming a smooth ILD layer and is replaced by a metal gate (i.e. replacement gate).

The material of the gate dielectric layer 130 may include a high K (dielectric constant) material or a low K material, for example, $SiO_2$, $ZrO_2$, $HfO_2$, $Al_2O_3$, HfSiO, HfSiON and/or a mixture thereof. With respect to a conventional CMOS, the gate dielectric layer usually comprises a low K material, such as $SiO_2$. With respect to the gate-first process or gate-last process of the high K dielectric/metal gate, the gate dielectric layer usually comprises $ZrO_2$, $HfO_2$, $Al_2O_3$, HfSiO, HfSiON and/or a mixture thereof. Said gate dielectric layer may be formed of a thermal growing process, such as oxidizing, nitridizing, or oxynitriding. Alternatively, the gate dielectric layer may be formed by a depositing process, for example, Chemical Vapor Deposition (CVD), plasma-assisted CVD, Atomic Layer Deposition (ALD), evaporation, reactive sputtering, chemical solution deposition or other similar depositing processes, and the gate dielectric layer may also be formed by a combination of any of the above-mentioned processes.

The gate conductor layer 132 may comprise a conductive material of any type, which includes, but is not limited to, polysilicon, metal or metal alloy, silicide, conductive nitride, polysilicon germanium or a combination thereof. With respect to a conventional CMOS device, the gate conductor is usually polysilicon, for example, while with respect to the front gate process of the high K dielectric/metal gate, the gate conductor may be metal or metal alloy.

Figure 2:
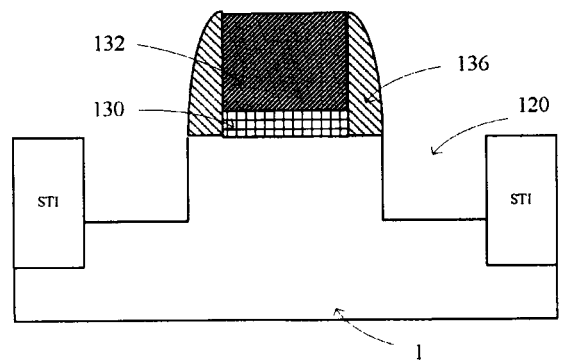
FIG. 2 shows the step of forming a groove in an embodiment of a method for manufacturing a semiconductor device according to the present invention.

Then, as shown in FIG. 2, grooves 120 are formed in the semiconductor substrate on the opposite sides of the gate structure using an etching process. As an example, the grooves are formed with a rectangular cross-section by anisotropic drying etching (e.g. RIE), the sidewalls of the grooves being perpendicular to the semiconductor substrate surface. Those skilled in the art would understand that the grooves may be formed with other shapes. For example, the grooves are formed by anisotropic drying etching, and the sidewalls thereof tilt at a certain angle with respect to the substrate surface; or the grooves may also be formed by isotropic wet etching, but the cross-section of the grooves thus formed is usually a curve. With respect to a given etching rate, the size of the grooves can be adjusted according to the time of etching.

Figure 3:
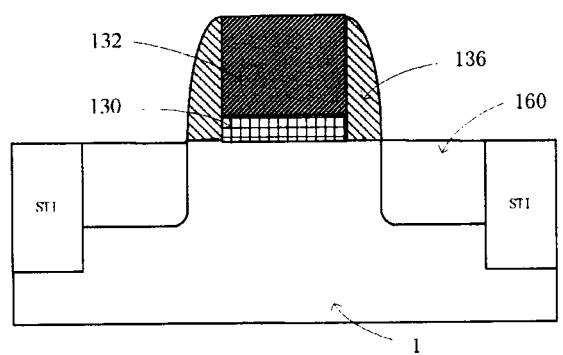
FIG. 3 shows the step of growing a second semiconductor material by a selective epitaxy in a groove region in an embodiment of a method for manufacturing a semiconductor device according to the present invention.

Next, as shown in FIG. 3, a second semiconductor material 160 is grown by selective epitaxial growth in the grooves. The second semiconductor material may be Si, but preferably, the second semiconductor material is different from the first semiconductor material.

During the epitaxial growth, a second semiconductor material is deposited on the exposed semiconductor surface, while no deposition occurs in the insulator surface, namely, the growth of the second semiconductor material is selective to the insulator surface. The exposed semiconductor surface mainly includes the inner surface of the grooves. The second semiconductor material epitaxially grown in the grooves forms a source region and a drain region.

With respect to a P type semiconductor device (i.e. PMOS device), the second semiconductor material may be $Si_{1-x}Ge_x$ (the atomic number percentage x of Ge may be 40%, and the content of Ge may be adjusted flexibly according to the need of the process, for example, x may be any value between 10%-70%, specifically, x may be 20%, 30%, 40%, 50% or 60%). The second semiconductor material may provide a compressive stress to the channel region of the PMOS device, which helps to improve the performance of the semiconductor device. The second semiconductor material may be formed by an epitaxial method using the silicon substrate as seed crystal.

With respect to an N type semiconductor device (i.e. an NMOS device), the second semiconductor material may be Si:C (the atomic number percentage of C may be 0-2%, for example, 0.5%, 1% or 1.5%, and the content of C may be adjusted flexibly according to the need of the process). The second semiconductor material may provide a tensile stress to the channel region of the NMOS device, which helps to improve the performance of the semiconductor device. The second semiconductor material may be formed by an epitaxial method using the silicon substrate as seed crystal.

Ion doping operation (i.e. doping in situ) may be directly performed during growing the second semiconductor material, for example, doping a reactant containing a doping ion component into the reactant for generating the second semiconductor material, or the ion doping may be performed through an ion implantation process after generating the second semiconductor material.

Doping in situ may have the following advantage: since the dopant introduced into the second semiconductor material is incorporated into the substituent position of the crystal lattice structure during the doping in situ, the need of activating and annealing the dopant is eliminated, thus minimizing the thermal diffusion of the dopant.

Although the present invention is described by the source region and drain region being substantially co-planar with the top surface of the semiconductor substrate 1, the source region and drain region may rise to be above the top surface of the semiconductor substrate, and said change is explicitly considered herein. Alternatively, with respect to the PMOS device, the formed second semiconductor material is higher than the top surface of the semiconductor substrate; with respect to the NMOS device, the formed second semiconductor material is co-planar with the top surface of the semiconductor substrate.

Figure 4:
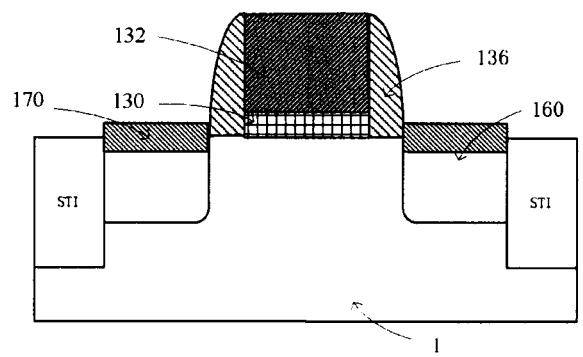
FIG. 4 shows the step of forming a metal semiconductor alloy on the source region and drain region in an embodiment of a method for manufacturing a semiconductor device according to the present invention.

A metal layer (not shown) is deposited and is induced to react with the semiconductor material thereunder to perform annealing, thereby forming a metal semiconductor alloy 170 (as shown in FIG. 4) on the source region and drain region.

According to the present invention, preferably, a gate metal semiconductor alloy is not formed on the gate conductor layer 132. When the second semiconductor material includes such silicon alloy as silicon germanium alloy or silicon carbon alloy, the source and drain metal semiconductor alloys include such silicide alloy as silicide germanide alloy or silicide carbon alloy. The methods of forming various metal semiconductor alloys are known in the prior art.

Figure 5:
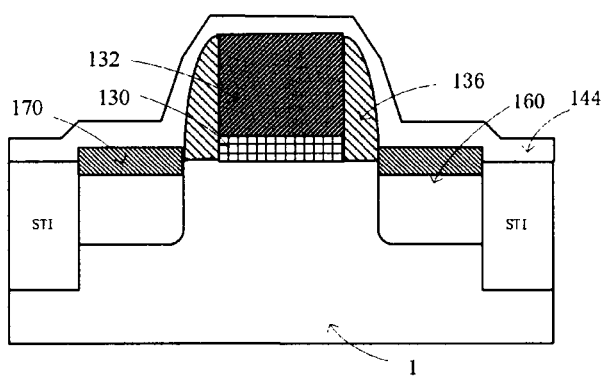
FIG. 5 shows the step of forming an etch stop layer in an embodiment of a method for manufacturing a semiconductor device according to the present invention.

Then, as shown in FIG. 5, an etch stop layer 144, e.g. a silicon nitride layer, is formed on the semiconductor substrate. With respect to the NMOS device region, the silicon nitride layer can form a tensile stress layer; with respect to the PMOS device region, the silicon nitride layer can form a compressive stress layer.

Figure 6:
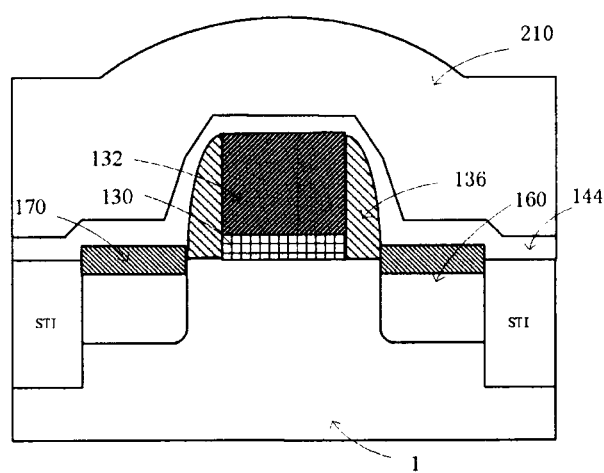
FIG. 6 shows the step of depositing a low temperature oxide (LTO) layer in an embodiment of a method for manufacturing a semiconductor device according to the present invention.

Next, as shown in FIG. 6, a low temperature oxide (LTO) layer 210 is deposited on the semiconductor structure shown in FIG. 5. The thickness of the LTO layer 210 is about 50 nm to 500 nm. The Chemical Vapor Deposition process for forming the LTO layer 210 is known.

Figure 7:
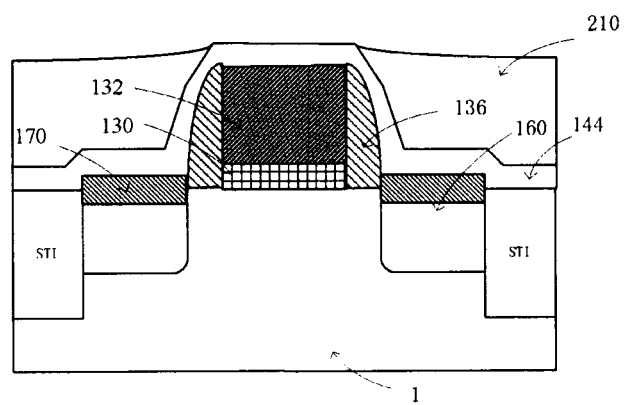
FIG. 7 shows the step of planarizing the LTO layer in an embodiment of a method for manufacturing a semiconductor device according to the present invention.

Afterwards, as shown in FIG. 7, the LTO layer 210 is planarized until the etch stop layer. Various planarizing methods, such as Chemical Mechanical Polishing, may be used.

Figure 8:
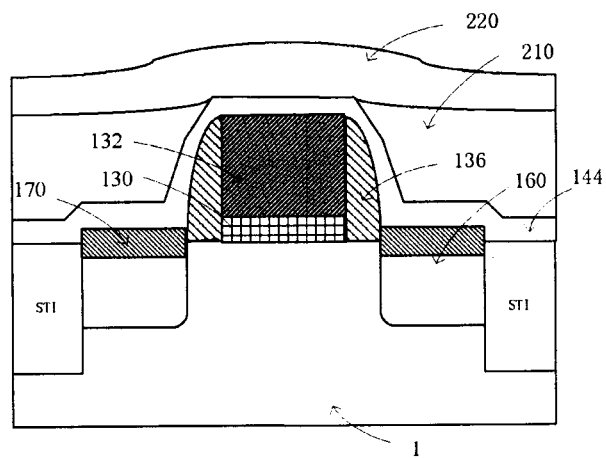
FIG. 8 shows the step of forming an SOG layer in an embodiment of a method for manufacturing a semiconductor device according to the present invention.

Subsequently, as shown in FIG. 8, a spin coating SOG layer 220 is formed on the planarized LTO layer 210. The thickness of the SOG layer 220 is about 10 nm to 500 nm. The spin coating process for forming the SOG layer 220 is known.

Figure 9:
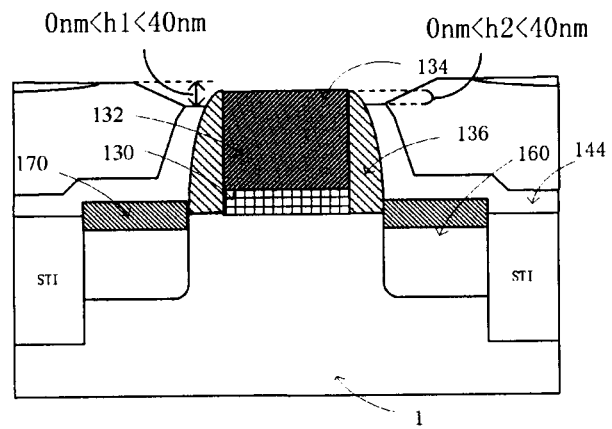
FIG. 9 shows the step of back etching the SOG layer and the etch stop layer in an embodiment of a method for manufacturing a semiconductor device according to the present invention.

Next, the SOG layer and etch stop layer are back etched by using a RIE process, as shown in FIG. 9. In said example, a Rainbow 4420 model plasma etching machine (bought from Lam Research Corporation of the United States) is used. For example, a RF power of about 400 W is used, and the etching gas is a gas mixture of trifluoromethane ($CHF_3$), tetrafluoromethane ($CF_4$) and argon (Ar), wherein the flow of $CHF_3$ is about 50 sccm, the flow of $CF_4$ is about 15 sccm, the flow of Ar is about 300 sccm, and the air pressure in the reacting chamber is kept at about 250 mtorr.

During the etching, the time of back etching is controlled, so that RIE removes the SOG layer and the etch stop layer to expose the polysilicon layer. The ratio of the etching rates of SOG and silicon nitride is greater than 1.2:1. The back etching stops when the SOG layer and the etch stop layer on the polysilicon layer are completely removed. Alternatively, the SOG layer on other parts of the semiconductor substrate is not completely removed. Results of measurement show that a height difference h1 of the surface profile of the obtained structure is within a range of about $0\ nm<H_1<40\ nm$, and a height difference h2 is within a range of about $0\ nm<H_1<40\ nm$.

Then, the gate conductor 132 is removed by Cl-based RIE or TMAH wet etching. Since the top of the gate conductor 132 has been exposed, the etchant may reach the gate conductor 132 so as to easily remove the gate conductor 132.

Figure 10:
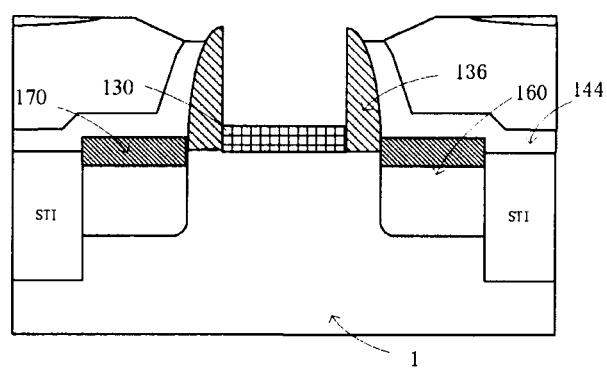
FIG. 10 shows a schematic cross-section of the semiconductor structure after removing the polysilicon dummy gate according to the method of the present invention.

FIG. 10 shows a schematic cross-section of the semiconductor structure after removing the polysilicon dummy gate according to the method of the present invention, wherein an opening is formed whose bottom is the gate dielectric. The etching process of removing the gate conductor of the polysilicon is known.

Figure 11:
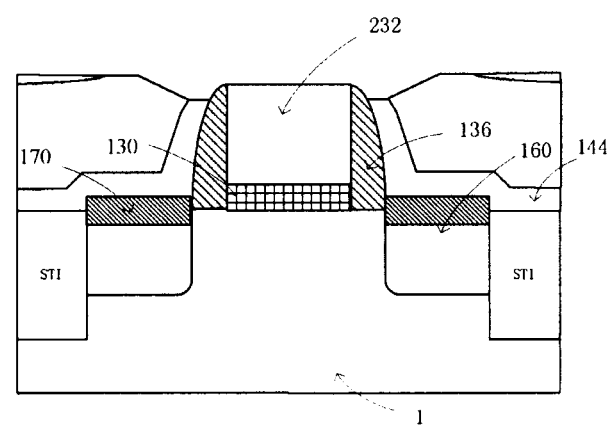
FIG. 11 shows a schematic cross-section of the semiconductor structure after forming the metal gate according to the method of the present invention.

FIG. 11 shows a schematic cross-section of the semiconductor structure after forming the metal gate according to the method of the present invention, wherein the opening is filled with the material of the metal gate 232. The metal gate 232 may be formed of a refractory metal (e.g. w, Ti, Ta, Mo) and metal nitride (e.g. TiN, TaN, HfN, MoN). The metal gate 232 may be formed by such methods as low pressure chemical vapor deposition, metal organic chemical vapor deposition, atomic layer deposition and sputtering, and the thickness thereof may be 20-5000 nm.

Alternatively, in the step shown in FIG. 10, not only the gate conductor is removed, but the bottom gate dielectric is further removed, so that the bottom of the opening becomes the top surface of the semiconductor substrate. Then, in the step shown in FIG. 11, a new gate dielectric and metal gate electrode are deposited.

After finishing the steps shown in FIGS. 1-11, according to the method known in the art, vias, wiring or contacts are formed so as to complete other parts of the semiconductor device.

As described above, the present invention provides a semiconductor device manufacturing method, wherein a semiconductor substrate is provided first, a gate conductor layer as well as a source region and a drain region on both sides of the gate conductor layer are formed on the semiconductor substrate, an etch stop layer is formed on the semiconductor substrate, an LTO layer is formed on the etch stop layer, the LTO layer is subject to chemical mechanical polishing, an SOG layer is formed on the polished LTO layer, the etch stop layer, LTO layer and SOG layer form a pre-metal insulating layer, the SOG layer and the etch stop layer of the pre-metal insulating layer are back etched to expose the gate conductor layer, the gate conductor layer is removed, and finally other conventional processes are performed to finish manufacturing of the semiconductor device.

According to the present invention, preferably, after the back etching, the overall smoothness of the pre-metal insulating layer is greater than 90%, the overall smoothness of the pre-metal insulating layer at the isolation region and the active region is greater than 90%, and the smoothness of the pre-metal insulating layer near the gate conductor layer is greater than 70%.

According to the present invention, preferably, the profile of the pre-metal insulating layer above the gate conductor layer is a concave, the highest point and lowest point of the concave having a height difference of 0~40 nm, and the projection of the polysilicon dummy gate is 0~40 nm from the nearest pre-metal insulating layer.

According to the present invention, preferably, the etch stop layer is a silicon nitride layer, and the gate conductor layer is a polysilicon layer. At the interface between the silicon nitride and the SOG, the ratio of etching rates of the silicon nitride and the SOG is greater than 1.2:1. An overall planarizing of the pre-metal insulating layer is realized through the chemical mechanical polishing step, the back etching step as well as the ratio of etching rates of the silicon nitride and the SOG together.

According to the present invention, preferably, the silicon nitride layer is a stress layer, which is used for detecting the terminal of chemical mechanical polishing the LTO layer.

According to the present invention, preferably, the ratio of the rate of back etching the SOG layer and the etch stop layer of the pre-metal insulating layer and the rate of etching the gate conductor layer is greater than 3:1.

According to the present invention, preferably, the SOG layer may be of an insulating material having a low coefficient of viscosity, such as photoresist; the LTO layer may be of a conformal insulating material, such as BPSG, $SiO_2$, F—$SiO_2$, C—$SiO_2$ or low-k.

According to the present invention, preferably, an LTO layer having a thickness of 50 nm-500 nm is formed on the etch stop layer, an SOG layer of 10 nm-500 nm is formed on the polished LTO layer, and the thickness of the metal insulating layer is 10 nm-300 nm after back etching.

In addition, the scope to which the present invention is applied is not limited to the process, mechanism, manufacture, material composition, means, methods and steps described in the specific embodiments in the specification. Those skilled in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the teaching of the present invention without departing from the protection scope thereof.

The present invention is described with reference to specific preferred embodiments, but other embodiments are also feasible, for example, other types of stress generation materials can also be used, as will be apparent to those skilled in the art. In addition, any step for forming the stressed layer can also be used according to the parameters of the described embodiments, as will be apparent to those skilled in the art. Therefore, the spirit and scope of the appended claims should not be limited to the descriptions of the preferred embodiments given herein.

What is claimed is:

1. A semiconductor device manufacturing method, comprising:
   providing a semiconductor substrate including an active region defined by shallow trench isolation (STI) region, on which a gate conductor layer as well as a source region and a drain region positioned on both sides of the gate conductor layer are provided,
   forming an etch stop layer on the semiconductor substrate,
   forming an oxide layer on the etch stop layer,
   chemical mechanical polishing the oxide layer to expose the etch stop layer,
   forming an SOG layer on the polished oxide layer, the etch stop layer, oxide layer and SOG layer forming a pre-metal insulating layer,
   back etching the SOG layer and etch stop layer of the pre-metal insulating layer to expose the gate conductor layer,
   removing the gate conductor layer to form an opening, and filling the opening with a material comprising metal, to form a metal gate.

2. The method according to claim 1, wherein the overall smoothness of the pre-metal insulating layer after the back etching is greater than 90%.

3. The method according to claim 1, wherein the overall smoothness of the pre-metal insulating layer in the STI region and the active region after the back etching is greater than 90%.

4. The method according to claim 1, wherein the smoothness of the pre-metal insulating layer near the gate conductor layer after the back etching is greater than 70%.

5. The method according to claim 1, wherein the profile of the pre-metal insulating layer above the gate conductor layer is a concave, the highest point and lowest point of the concave having a height difference which is larger than 0 but less than 40 nm.

6. The method according to claim 1, wherein a projection of the gate conductor layer is 0~40 nm from the nearest pre-metal insulating layer.

7. The method according to claim 1, wherein an oxide layer having a thickness of 50 nm-500 nm is formed on the etch stop layer.

8. The method according to claim 1, wherein an SOG layer of 10 nm-500 nm is formed on the polished oxide layer.

9. The method according to claim 1, wherein the thickness of the pre-metal insulating layer is 10 nm-300 nm after back etching.

10. The method according to claim 1, wherein the SOG layer is of an insulating material having a coefficient of viscosity.

11. The method according to claim 10, wherein the insulating material having a coefficient of viscosity includes a photoresist.

12. The method according to claim 1, wherein the oxide layer is of a conformal insulating material.

13. The method according to claim 12, wherein the conformal insulating material includes one of BPSG, SiO2, F—SiO2, C—SiO2 and low-k.

14. The method according to claim 1, wherein the etch stop layer is a silicon nitride layer, and the gate conductor layer is a polysilicon layer.

15. The method according to claim 14, wherein the silicon nitride layer is a stress layer, which is used for detecting the terminal of chemical mechanical polishing the oxide layer.

16. The method according to claim 14, wherein the ratio of the rate of back etching the SOG layer and the etch stop layer of the pre-metal insulating layer and the rate of etching the gate conductor layer is greater than 3:1.

17. The method according to claim 14, wherein at the interface between the silicon nitride and the SOG, the ratio of etching rates of the silicon nitride and the SOG is greater than 1.2:1.

18. The method according to claim 17, wherein an overall planarizing of the pre-metal insulating layer is realized through the chemical mechanical polishing step, the back etching step as well as the ratio of etching rates of the silicon nitride and the SOG together.

* * * * *